_(12)_ United States Patent
Hook et al.

(10) Patent No.: US 6,271,565 B1
(45) Date of Patent: Aug. 7, 2001

(54) ASYMMETRICAL FIELD EFFECT TRANSISTOR

(75) Inventors: Terence B. Hook, Jericho Center; Dennis Hoyniak; Edward J. Nowak, both of Essex Junction, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/516,544

(22) Filed: Mar. 1, 2000

Related U.S. Application Data

(62) Division of application No. 08/889,991, filed on Jul. 10, 1997, now Pat. No. 6,083,794.

(51) Int. Cl.⁷ .................................................. H01L 31/119
(52) U.S. Cl. .......................... 257/344; 257/346; 257/408
(58) Field of Search ................... 438/286, 302, 438/525, 305; 257/346, 344, 405

(56) References Cited

U.S. PATENT DOCUMENTS

| | | |
|---|---|---|
| Re. 35,036 | 9/1995 | Yabu et al. . |
| 4,232,439 | 11/1980 | Shibata . |
| 5,188,975 | 2/1993 | Kojima et al. . |
| 5,190,887 | 3/1993 | Tang et al. . |
| 5,198,384 | 3/1993 | Dennison . |
| 5,240,874 | 8/1993 | Roberts . |
| 5,344,787 | 9/1994 | Nagalingam et al. . |
| 5,346,841 | 9/1994 | Yajima . |
| 5,355,006 | 10/1994 | Iguchi . |
| 5,382,540 | 1/1995 | Sharma et al. . |
| 5,386,131 | 1/1995 | Sato . |
| 5,416,349 | 5/1995 | Bergemont . |
| 5,429,960 | 7/1995 | Hong . |
| 5,432,107 | 7/1995 | Uno et al. . |
| 5,441,910 | 8/1995 | Nakashiba . |
| 5,496,747 | * 3/1996 | Hong . |
| 5,705,410 | 1/1998 | Guegan . |
| 5,770,502 | 6/1998 | Lee . |
| 5,783,457 | 7/1998 | Hsu . |
| 5,851,886 | 12/1998 | Peng . |
| 5,891,774 | 4/1999 | Ueda et al. . |
| 5,915,185 | 6/1999 | Fratin et al. . |
| 5,920,776 | 7/1999 | Fratin et al. . |
| 6,083,794 | * 7/2000 | Hook et al. ............ 438/286 |

OTHER PUBLICATIONS

Electronics and Communications in Japan, Part 2, vol. 73, No. 3, 1990 "Improvement of Asymmetrical Characteristics in Submicron CMOS Devices".

IEEE CAT., No. 88 CH–2597–3, 1988 Symposium of VLSI Technology Digest of Technical Papers, May 10–13, 1988, A New Submicron MOSFET with LATID (Large Tilt–Angle Implanted Drain) Structure.

* cited by examiner

*Primary Examiner*—Long Pham
(74) *Attorney, Agent, or Firm*—DeLio & Peterson, LLC; Peter W. Peterson; Howard J. Walter, Jr.

(57) ABSTRACT

A method of producing an asymmetrical semiconductor device with ion implantation techniques and semiconductor devices constructed according to this method in which a barrier of ion absorbing material of height h is positioned beside a structure on a semiconductor surface. The barrier is located at a maximum distance d from one side of the structure, and an angled ion implant is directed at the side of the structure. The maximum distance d of the barrier from the side of the structure is equal to the height of the barrier h divided by the tangent of the angle of the ion implant so that the side of the structure is shadowed from the ion implant. A second ion implant is directed to the opposite side of the structure on the semiconductor surface, thereby forming a desired implant and producing the asymmetrical semiconductor device.

11 Claims, 2 Drawing Sheets

ASYMMETRICAL FIELD EFFECT TRANSISTOR

This is a continuation divisional of application(s) Ser. No. 08/889,991 filed on Jul. 10, 1997, now U.S. Pat. No. 6,088,794.

BACKGROUND OF THE INVENTION

1. Field of the Invention

This invention relates to a method of producing an asymmetrical semiconductor device using angled ion implantation techniques. More specifically, this invention relates to a method of placing shallow ion implants under one side of a structure on a semiconductor surface, such as the gate of a field effect transistor.

2. Description of Related Art

Semiconductor devices, such as metal oxide semiconductor field effect transistors (MOSFETs), produced with angled ion implantation techniques are often constructed symmetrically. This allows great flexibility in the layout of multiple devices as the source and drain are interchangeable (and both sides of the gate are consequently referred to simply as the "source/drain").

For some applications, this type of device symmetry is highly desirable or essential. Further, uncontrolled device asymmetry is objectionable and for these reasons, devices produced by angled ion implantation are generally made symmetric by rotating the semiconductor to allow the angled implant beam to implant from all sides of the gate. This results in a series of symmetrical implants and a symmetrical device.

However, for certain applications performance can be improved if the semiconductor device is constructed asymmetrically. One particular example of this is in the construction of semiconductor devices with angled ion implantation techniques employing a lightly doped drain (LDD) region or a halo region. The LDD is desirable on the drain side of a MOSFET, and a halo is desirable on the source side of the MOSFET gate. However, a symmetrical device with an LDD on the drain side has an LDD region on the source side of the gate as well. A symmetrical device with a halo on the source has one on the drain side as well.

The addition of an LDD region degrades device performance through increased series resistance and overlap capacitance. Since the lightly doped LDD region is strictly required only on the drain side of the device to mitigate hot carrier degradation, the LDD on the source side of a symmetrical device adds undesired series resistance and capacitance. Device performance can be improved if the LDD implant could be blocked from the source side thereby making an asymmetrical device. Where a particular device is never subjected to high voltages, blocking the LDD implant from both ends may also advantageous.

The LDD implant is often created by an implant normal to the semiconductor surface. The energy and dose are chosen so as to produce the desired effect. In order to produce multiple asymmetric devices, a very accurately-aligned critical mask capable of blocking the implant beam from the source side, but not blocking it from the drain side, must be used.

Alternatively, the LDD implant may be produced through an angled ion implant beam which places the implant under one side of the gate. Thus, the desired LDD is formed when the appropriate ion implant beam is directed at an angle towards the drain side of the gate. To produce multiple asymmetrical devices on the same semiconductor substrate requires that all of the devices be oriented in the same direction so that a single ion implant step can produce all of the LDD regions desired.

To achieve symmetry, angled ion implants are normally applied with four rotations. Only one of the four rotations, however, will primarily establish the desired LDD or halo implant for any particular device. This is because only one of the four directions will allow the ions to implant underneath the desired edge of the gate. Of the remaining three rotations, two will be approximately parallel to the sides of the gate and will fail to penetrate underneath the edge of the gate as is necessary to form the implant. The last of the four rotations will produce the undesired implant on the opposite side of the gate from the desired implant.

It can be seen that controlled device asymmetry is possible if all the devices are oriented in the same direction and the opposite direction rotation is omitted. Alternatively, a critical mask may be used to protect the half of the gate that should not receive an implant. Neither of these options, however, is particularly desirable. Orienting all of the devices in the same direction significantly limits layout flexibility. On the other hand, the gate dimension is generally as small as it is feasible to construct. To block the implant on one side, but not on the other side of the gate requires aligning a critical mask to within the width of the gate. This has required alignment tolerance within one half the width of the gate. Obtaining such critical alignment is an expensive and error-prone procedure.

The same problem is encountered when constructing a halo implant only on the source side of the device. If the halo implant is placed on the drain side, it increases junction capacitance and peak electric field. Achieving halo implants only on the source side has heretofore required the same choice between an expensive critical mask with alignment comparable to half the gate width or the uniform device orientation such that all of the devices have the source on the same side.

In view of the limitations on layout flexibility or the cost of using a critical mask, it has heretofore been preferable to accept the reduced performance from a symmetrical device having an undesired LDD region on the source side of the device and an undesired halo region on the drain side of the device.

Bearing in mind the problems and deficiencies of the prior art, it is therefore an object of the present invention to retain layout flexibility by permitting any desired device orientation, while allowing the use of a non-critical mask to form asymmetrical semiconductor devices.

Still other objects and advantages of the invention will in part be obvious and will in part be apparent from the specification.

SUMMARY OF THE INVENTION

The present invention achieves its objects through the use of a vertical barrier of ion absorbing material, preferably photoresist, which is selectively placed near a structure on a semiconductor surface, such as the gate on a MOSFET. The thickness of the ion absorbing material forms a barrier of height h extending upward from the semiconductor surface. This barrier casts an angled shadow which blocks an angled ion beam directed towards the side of the structure. The relationship between the height h of the barrier, the angle of the ion beam and the shadow being cast by the barrier is such that the mask for creating the barrier can be positioned with a much looser tolerance than would otherwise be required to produce an asymmetrical device.

Although the present invention may find application in various types of ion implanted semiconductor devices, the invention will be described here in connection with its application in MOSFET technology in which the structure on the semiconductor surface is the gate of a MOSFET.

During the angled ion implantation process, the barrier of ion absorbing material casts a shadow that extends away from the base of the barrier during one of the four ion implant rotations. The shallower the angle of the ion beam (measured relative to the semiconductor surface) and the higher the height h of the barrier, the longer the shadow. In order to block the formation of an ion implant under the gate structure, it is only necessary to place the barrier with sufficient accuracy to ensure that the shadow (or the photoresist barrier itself) covers the base of the gate structure on the side of the structure to blocked. This will occur whenever the barrier is within a maximum distance d from the side of the gate structure where d is equal to the height of the barrier h divided by the tangent of the angle of the ion implant measured relative to the semiconductor surface.

To successfully block the undesired implant, the barrier may be positioned at any point between the maximum distance d and the far side of the gate structure. Thus, the barrier may cover some portion or all of the gate (having a width l), as would occur with a critical mask, or it may simply cast a shadow onto the side of the gate to be protected. The farthest away it may be from the side of the gate is the distance d calculated above. Accordingly, the alignment accuracy of the mask used to form the barrier is one half the sum of the width of the gate l plus the maximum distance d. This alignment tolerance can be achieved with a non-critical mask which is relatively inexpensive to implement.

More specifically, the invention may be summarized as comprising a method of producing an asymmetrical semiconductor device with ion implantation, comprising the steps of:

providing a semiconductor surface having a structure positioned upon the semiconductor surface, the structure having a first side and a second side;

forming a barrier of height h extending upward from the semiconductor surface at a location between the second side of the structure and a maximum distance d from the first side of the structure;

performing a first side ion implant at an angle of between zero and ninety degrees relative to the semiconductor surface and directed at the first side of the structure, the maximum distance d being equal to the height of the barrier h divided by the tangent of the angle of the first side ion implant; and performing a second side ion implant at an angle of between zero and ninety degrees relative to the semiconductor surface and directed at the second side of the structure.

In the most highly preferred embodiment, the method includes simultaneously producing a plurality of additional asymmetrical semiconductor devices in arbitrary orthogonal orientations relative to the first asymmetrical semiconductor device by forming the barrier for the first asymmetrical semiconductor device of an ion absorbing photoresist exposed with a non-critical mask and simultaneously forming a plurality of additional barriers for the additional asymmetrical semiconductor devices in corresponding arbitrary orthogonal orientations.

Using this method, the standard technique of performing four ion implant steps at ninety degree rotations may still be used. Only the single rotation direction producing the undesired implant will be blocked. The opposite rotation will produce the desired implant, and the two remaining rotations that have the beam parallel to the gate will still have almost no effect.

The present invention also includes the asymmetrical semiconductor devices produced according to the method of the invention. Most typically, this will include a field effect transistor, having an LDD on the drain side of the gate, but not on the source side of the gate, or having a halo on the source side of the gate, but not on the drain side of the gate, or both.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1–4 of the drawings in which like numerals refer to like features of the invention.

Figure 1:
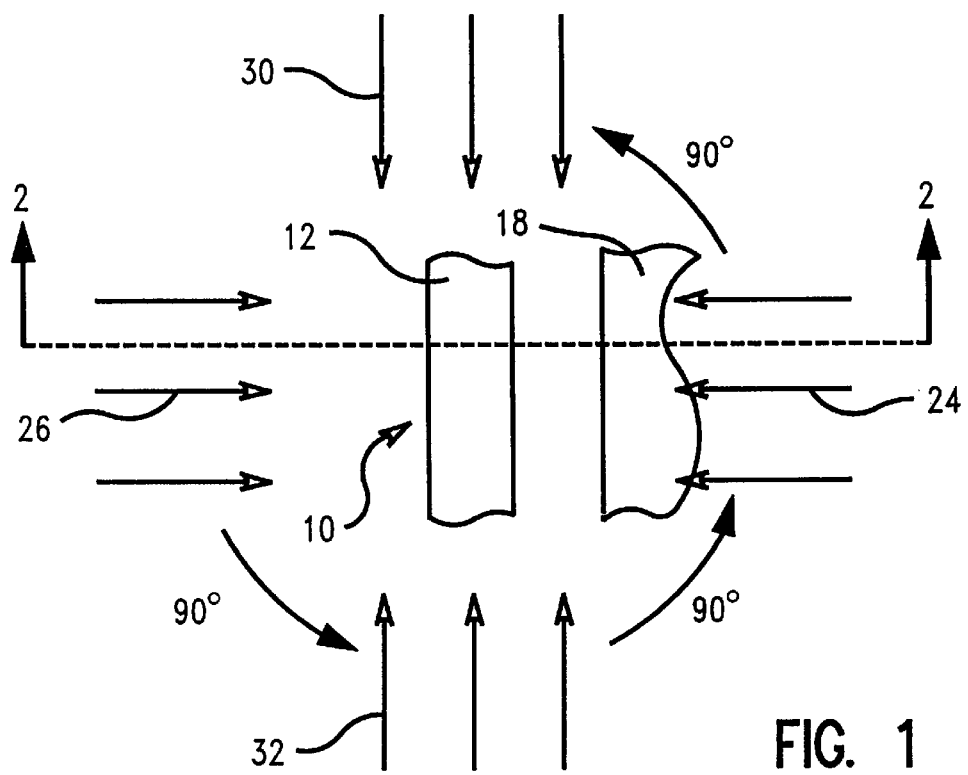
FIG. 1 provides a top plan view of a single semiconductor device under construction in accordance with the present invention.

FIG. 1 provides a top plan view of a semiconductor device under construction in accordance with the present invention. A semiconductor surface 10 has a structure 12, such as the gate of a field effect transistor positioned upon it. As indicated by the cutaway at the ends of the gate 12, the gate may extend for some distance. Additional transistors will usually be positioned in an array around the transistor illustrated, and these transistors may be in any orientation relative to the transistor shown. In most implementations, however, the additional transistors will only be in one of four possible orthogonal orientations.

Figure 2:
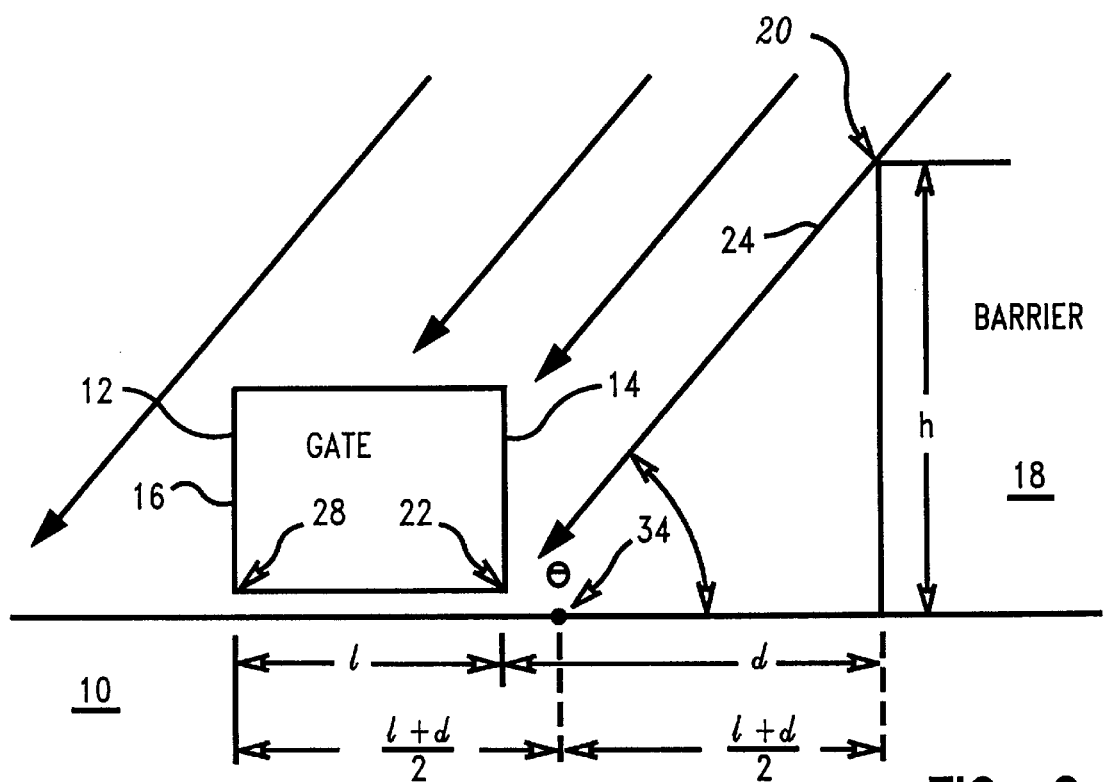
FIG. 2 provides a side cross-sectional view taken along the line 2—2 shown in FIG. 1.

Referring to FIG. 2 which shows the gate 12 in cross section, it can be seen that the gate has a first side 14 and an opposite second side 16, separated by a gate width 1. Positioned a distance d away from the first side 14 is a barrier 18 of an ion absorbing material, preferably photoresist, having a height h.

FIG. 2 illustrates that the barrier 18 of height h casts a shadow from its upper corner 20 which exactly hits the lower corner 22 on the first side 14 of gate 12 when ion implant beam 24 is directed at the first side 14 and has an angle θ measured relative to the semiconductor surface 10.

Thus, FIG. 2 illustrates the maximum distance d that the barrier 18 may be placed away from the first side 14 of the gate structure 12 and still protect the lower corner 22 of the gate from the incoming angled ion beam 24. If the barrier 18 is placed any farther to the right, i.e. beyond the maximum distance d, the first side ion implant beam 24 will not be blocked.

Generally, the barrier 18 may be placed at any point between side 14 of the gate and the maximum distance d shown in FIG. 2. It may also be placed on the upper surface of the gate structure 12 at any point between the first side 14 and the second side 16. It cannot be placed to the left of the second side 16, however, because in this position the barrier would block an ion implant beam, such as the ion implant beam 26 in FIG. 1, directed toward the second side 16 of the gate. Ion implant beam 26 is the beam which will produce the desired ion implant under the left lower corner 28 of the gate 12.

FIG. 1 illustrates how angled ion implants are generally done with four separate 90° rotations corresponding to angled ion implant beams 24, 26, 30 and 32. Generally, the semiconductor surface 10 will be rotated by 90° between each implant. Implants arriving from the directions indicated with reference numbers 30 and 32, i.e. which are parallel to the sides 14 and 16 of the gate will not penetrate below the corners 28 and 22 and will not create LDD or halo structures. These beams may be used, however, to form the LDD or halo regions on other devices on the same semiconductor surface 10 having an orientation at 90° or 270° to the device shown in FIG. 1. It will be understood that generally the semiconductor surface 10 will have multiple semiconductor devices under construction at various orthogonal orientations relative to that seen in the device of FIGS. 1 and 2.

In the device shown, ion beam 26 will form the desired implant under corner 28 of the gate 12 whereas ion beam 24 will be blocked by the barrier 18 whenever its ion beam shadow strikes corner 22 of the gate. This criterion will be met provided that the barrier 18 is placed at some point between the side 16 of the gate and a maximum distance d away from the side 14 of the gate, where d is equal to the height of the barrier h divided by the tangent of the angle θ. The shallower the angle θ and the higher the barrier h, the greater the tolerance of the position error in placing the barrier.

It will be understood that the barrier 18 will normally be placed somewhere near the point 34 and that the alignment error may be as large as one half the sum of l plus d, where d is given by the relationship above of h divided by the tangent of angle θ. By selecting the angle θ and the height h, the tolerance error for positioning the mask may be adjusted.

Figure 3:
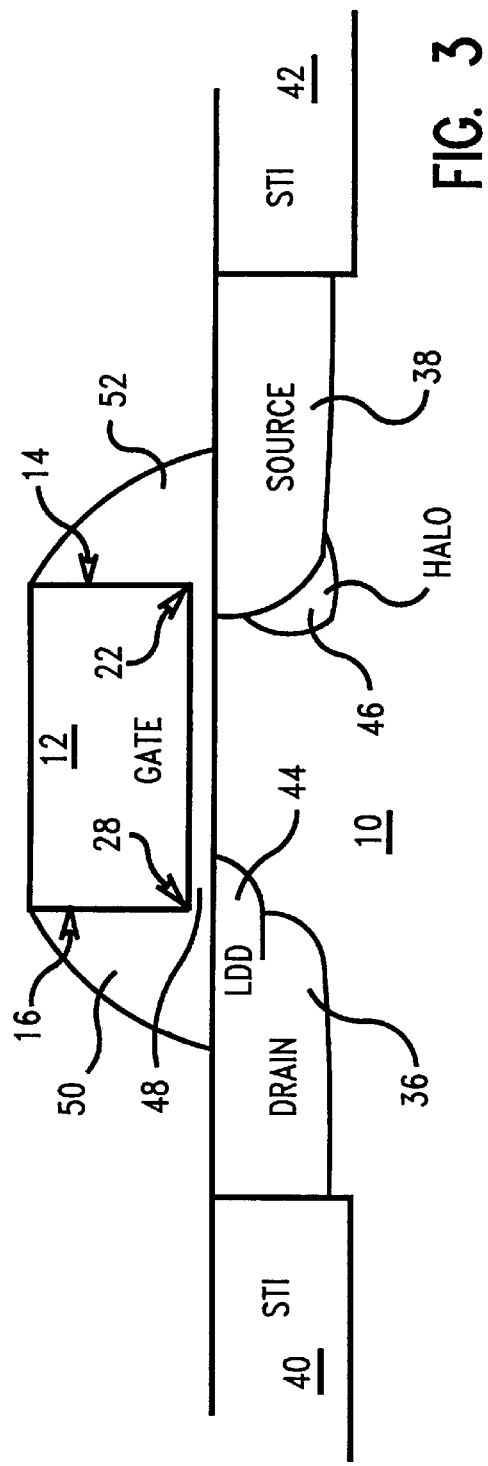
FIG. 3 provides a cross-sectional view of the completed semiconductor device in accordance with the present invention.

FIG. 3 shows the effects of ion implantation in the semiconductor surface and the resulting asymmetrical semiconductor device produced by the present invention. The semiconductor device includes a drain region 36, a source region 38 and shallow trench isolation (STI) regions 40 and 42 on either side thereof.

The drain region 36 includes a lightly doped drain (LDD) region 44, which was produced during the ion implant beam 26 in FIG. 1. It will be noted that there is no corresponding LDD region underneath corner 22 of the gate 12. This is because the barrier 18 blocked the ion implant beam 24. Ion implant beams 30 and 32 were not oriented in the proper direction to implant underneath either corner 22 or corner 28. Because the barrier 18 would block only one of the four beams (beam 24 for the device in FIGS. 1 and 2), it can remain on the semiconductor surface during all four rotations of the implant process.

For other semiconductor devices at other orientations on the same surface, the barrier will simply be positioned relative to the other devices to shield the necessary side. Of course, all of these barriers will be laid down with a single non-critical mask. For symmetrical devices, no barrier will be laid down, and for devices where no implant is desired, the photoresist barrier can be used to cover the gate entirely.

The device shown in FIG. 3 also illustrates a halo region 46 found only on the source side, and not on the drain side. This makes the device doubly asymmetric. The halo would be formed by constructing another barrier on the left side, i.e. on the drain side of FIG. 3 so that the shadow of this barrier would shield corner 28 of the gate 12, but would not shield corner 22 of gate 12. The halo, like the LDD region, would be formed during one of four rotations in a manner which exactly corresponds to the four rotations described in FIG. 1 in connection with the formation of the LDD region 44.

Since different ions are used during creation of the halo, and because the opposite side of the gate must be protected from the beam, a separate barrier and a separate masking step must be completed to achieve this construction. Nonetheless, the steps for the halo masking and for the LDD masking are essentially identical.

The gate 12 is conventionally positioned above an oxide layer 48 which separates it from the semiconductor surface 10 and the device shown also includes sidewall spacers 50 and 52. If desired, the halo region 46 or the LDD region 44 may be omitted.

Figure 4:
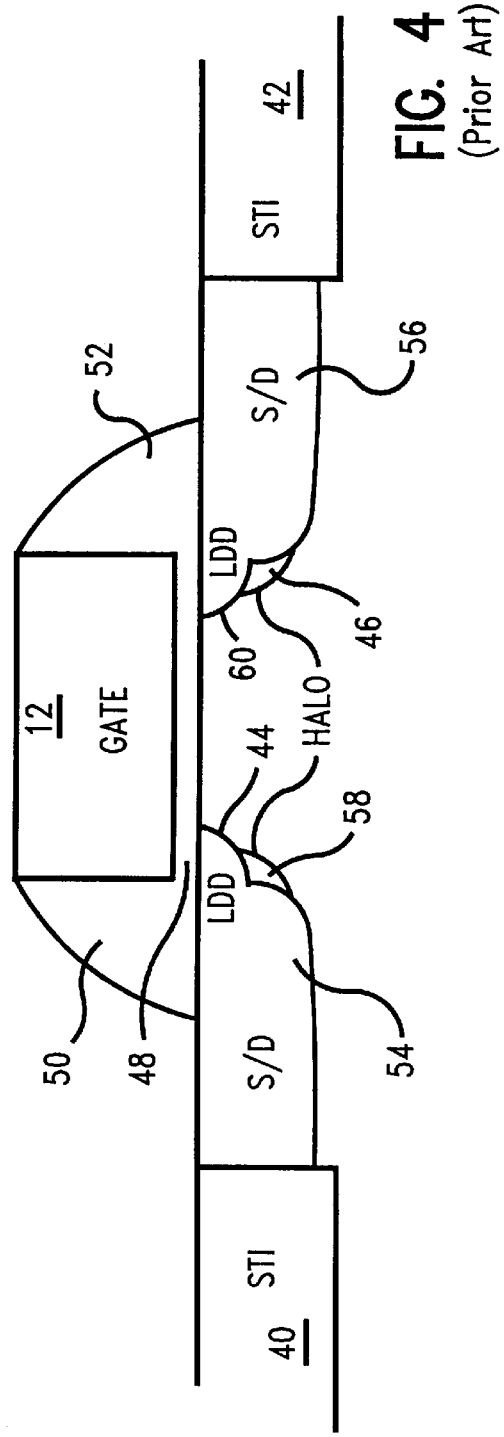
FIG. 4 provides a side cross-section view of a symmetrical device constructed in accordance with the prior art.

The construction of the device in FIG. 3 may be compared to the construction of a symmetrical semiconductor device of the prior art shown in FIG. 4. In this device, the drain and source are symmetrical and accordingly either region 54 or region 56 may act as the source or as the drain. Halo 46 has a symmetrical halo region on the opposite side 58 and LDD region 44 has a symmetrical LDD region at 60 on the opposite side.

Typically, the construction of multiple semiconductor devices includes numerous masking steps. The construction of the photoresist barrier 18 may often be incorporated into one of these non-critical masking steps without requiring additional process steps to implement this invention.

The present invention is directed both to the method of constructing one or more asymmetrical semiconductor devices using the steps described as well as to the resulting semiconductor device prepared according to the method. The invention is particularly well suited to making multiple asymmetrical devices on a single common substrate at different orthogonal orientations.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An asymmetrical field effect transistor produced according to a method comprising the steps of:
   providing a semiconductor surface having a structure created on the semiconductor surface, the structure having a first side and a second side;
   forming a barrier of height h extending upward from the semiconductor surface at a location between the second side of the structure and a maximum distance d from the first side of the structure, the step of forming a barrier being performed after the structure is created on the semiconductor surface;

performing a first side ion implant at an angle of between zero and ninety degrees relative to the semiconductor surface and directed at the first side of the structure, the maximum distance d being equal to the height of the barrier h divided by the tangent of the angle of the first side ion implant; and performing a second side ion implant at an angle of between zero and ninety degrees relative to the semiconductor surface and directed at the second side of the structure.

2. The asymmetrical field effect transistor of claim 1 wherein the structure created on the semiconductor surface is the gate of the field effect transistor, the first side of the gate is on the source side of the gate, the second side of the gate is on the drain side of the gate and the method produces a lightly doped drain region on the drain side of the gate, and does not produce a lightly doped drain region on the source side of the gate.

3. The asymmetrical field effect transistor of claim 2 wherein the field effect transistor has a halo region on the source side of the gate, and does not have a halo region on the drain side of the gate.

4. The asymmetrical field effect transistor of claim 1 wherein the structure created on the semiconductor surface is the gate of the field effect transistor, the first side of the gate is on the drain side of the gate, the second side of the gate is on the source side of the gate and the method produces a halo region on the source side of the gate, and does not produce a halo region on the drain side of the gate.

5. The asymmetrical field effect transistor of claim 1 in combination with a plurality of additional asymmetrical field effect transistors formed on the semiconductor surface, the additional asymmetrical field effect transistors being produced simultaneously with the first asymmetrical field effect transistor in arbitrary orthogonal orientations relative thereto by forming the barrier for the first asymmetrical field effect transistor of an ion absorbing photoresist exposed with a non-critical mask and simultaneously forming a plurality of additional barriers for the additional asymmetrical field effect transistors in corresponding arbitrary orthogonal orientations.

6. The asymmetrical field effect transistor of claim 1 wherein the method further includes the step of performing at least one additional ion implant directed at the semiconductor surface.

7. The asymmetrical field effect transistor of claim 6 wherein the ion implant steps of the method comprise performing four ion implant steps at an angle of between zero and ninety degrees relative to the semiconductor surface, the four ion implant steps being separated by three semiconductor surface rotation steps during each of which the semiconductor surface is rotated by approximately ninety degrees.

8. The asymmetrical field effect transistor of claim 1 wherein the barrier is formed of ion absorbing photoresist.

9. The asymmetrical field effect transistor of claim 8 wherein the photoresist is exposed to form the barrier with a non-critical mask.

10. The asymmetrical field effect transistor of claim 9 wherein the distance between the first side and the second side of the structure is length l and the non-critical mask is aligned within a tolerance of one half the sum of length l plus the maximum distance d.

11. The asymmetrical field effect transistor of claim 1 wherein the structure created on the semiconductor surface is the gate of the field effect transistor and wherein the method further comprises the steps of:

removing the barrier;

forming a new barrier of height h2 extending upward from the semiconductor surface at a location between the first side of the gate and a maximum distance d2 from the second side of the gate;

performing a drain side ion implant at an angle of between zero and ninety degrees relative to the semiconductor surface and directed at the second side of the gate, the maximum distance d2 being equal to the height of the new barrier h2 divided by the tangent of the angle of the drain side ion implant; and performing a source side ion implant at an angle of between zero and ninety degrees relative to the semiconductor surface and directed at the first side of the gate to form a halo region on the source side of the field effect transistor.

* * * * *